United States Patent
Yoshida et al.

[11] Patent Number: 5,827,445
[45] Date of Patent: Oct. 27, 1998

[54] COMPOSITE MAGNETIC ARTICLE FOR ELECTROMAGNETIC INTERFERENCE SUPPRESSOR

[75] Inventors: Shigeyoshi Yoshida; Mitsuharu Sato; Eishu Sugawara; Yutaka Shimada, all of Miyagi, Japan

[73] Assignee: Tokin Corporation, Miyagi, Japan

[21] Appl. No.: 714,805

[22] Filed: Sep. 17, 1996

[30] Foreign Application Priority Data

Sep. 22, 1995 [JP] Japan ................... 7-244096
Nov. 2, 1995 [JP] Japan ................... 7-309961
Nov. 24, 1995 [JP] Japan ................... 7-329597

[51] Int. Cl.$^6$ .......................... H01Q 17/00; C03C 14/00
[52] U.S. Cl. .................... 252/62.54; 252/62.55; 174/35 R
[58] Field of Search .................. 252/62.54, 62.55; 174/35 R

[56] References Cited

U.S. PATENT DOCUMENTS 2,873,225  2/1959  Adams et al. ................. 148/105
5,207,841  5/1993  Shigeta et al. ................. 252/62.55

FOREIGN PATENT DOCUMENTS

| 667643 | 8/1995 | European Pat. Off. . |
| 1152152 | 2/1958 | France . |
| 1024647 | 2/1958 | Germany . |
| 4-276002 | 10/1992 | Japan . |
| 7-212079 | 8/1995 | Japan . |
| 2232165 | 12/1990 | United Kingdom ................. 252/62.55 |
| 2257979 | 1/1993 | United Kingdom ................. 252/62.55 |

*Primary Examiner*—Melissa Bonner
*Attorney, Agent, or Firm*—Hopgood, Calimafde, Kalil & Judlowe

[57] ABSTRACT

A composite magnetic article for use as an electromagnetic interference suppressing body, which comprises soft magnetic powder of at least one soft magnetic composition having a magnetostriction constant, each of particles of the powder being flaky, and organic binding agent binding said soft magnetic powder dispersed therein. The soft magnetic powder is as annealed after being worked flaky. The flaky particles of the soft magnetic powder have an average thickness less than a skin depth within which the skin effect occurs at a frequency band for which said composite magnetic article is used, each having an oxide outer layers.

14 Claims, 1 Drawing Sheet ically interference is a serious problem against normal operation of those equipments, which interference is caused due to the electromagnetic coupling, the line-line coupling increased by the electromagnetic coupling, and noise radiation.

COMPOSITE MAGNETIC ARTICLE FOR ELECTROMAGNETIC INTERFERENCE SUPPRESSOR

BACKGROUND OF THE INVENTION

This invention relates to a composite magnetic article and, in particular, to such a magnetic article having an improved complex magnetic permeability at a high frequency band adaptable for an electromagnetic interference suppressor.

Among high frequency electronic equipments which have been widely used, mobile communication equipments using a quasi-microwave frequency band have rapidly been expanded in practical use. In the mobile communication equipment, a portable wireless telephone set is eagerly required to be small in size and light in weight. In order to satisfy the requirement, printed circuit boards, circuit elements, wire cables connecting between modules are disposed closely adjacent to one another in the limited small space. Furthermore, it is also required that the signal processing rate is also increased, so that a frequency used is elevated. As a result, the electromagnetic interference is a serious problem against normal operation of those equipments, which interference is caused due to the electromagnetic coupling, the line-line coupling increased by the electromagnetic coupling, and noise radiation.

In order to suppress the electromagnetic interference, an electric conductive shield has conventionally been used to reflect undesired electromagnetic waves due to impedance mismatch of the conductor and the space.

The electric conductive shield is useful for shielding the undesired electromagnetic wave. However, the reflection of the undesired electromagnetic wave unfortunately aggravates electromagnetic coupling between a source of the undesired electromagnetic wave and other electric circuit elements.

In order to avoid the electromagnetic coupling due to the reflection of the undesired electromagnetic wave, it is effective to dispose, between the undesired electromagnetic wave source and the conductive shield, a soft magnetic substance having a large magnetic loss or a high imaginary part permeability $\mu''$.

Generally speaking, a magnetic substance having a high magnetic permeability is used as a magnetic core for an inductance element and is also called soft magnetic substance. On use in an AC magnetic field of a high frequency, the soft magnetic material has the complex magnetic permeability which is represented by $(\mu'-j\mu'')$ A real part permeability $\mu'$ relates to an inductance and an imaginary part permeability $\mu''$ relates to a magnetic energy loss or a magnetic energy absorption. When the frequency becomes high, the real part permeability $\mu'$ is lowered but the imaginary part permeability $\mu''$ is increased. Furthermore, the imaginary part permeability $\mu''$ often has one or more peaks at different frequency points on the frequency axis. This phenomenon is known as a magnetic resonance of the soft magnetic substance. The frequency at which the peak is present is referred to as a magnetic resonance frequency. Moreover, a thickness d of the soft magnetic substance is reversely proportional to the imaginary part permeability $\mu''$ in a high frequency range where the imaginary part permeability $\mu''$ is larger than the real part permeability $\mu'$.

On the other hand, the undesired electromagnetic wave usually has a large number of frequency components which are within a wide frequency range. Accordingly, the soft magnetic substance is required to have a high imaginary part permeability $\mu''$ over a wide frequency range for absorption of the undesired electromagnetic wave.

In JP-A-7 212079 (Reference I), the present inventors already proposed an electromagnetic interference suppressor using soft magnetic powder having the shape magnetic anisotropy. The magnetic powder has the high magnetic loss over a wide frequency range from several tens megahertzs to several gigahertz. The magnetic loss is supposed to occur due to the magnetic resonance.

Electromagnetic interference suppressor proposed in Reference I uses flaky or flat soft magnetic powder of an alloy metal. The powder has an anisotropic magnetic field $H_k$ higher than another spherical powder of the same alloy metal. This is based on the magnetic anisotropy due to the flat or flaky shape, that is, a demagnetizing factor Nd. The demagnetizing factor Nd is determined by a shape of a powder particle and an aspect ratio. Accordingly, the magnetic resonance frequency is variable by changing the particle shape and the aspect ratio. However, the demagnetizing factor Nd is approximately saturated when the aspect ratio exceeds 10. Therefore, the variable range of the magnetic resonance frequency is limited.

On the other hand, the eddy current loss is known as a problem against improvement of the high frequency response of the soft magnetic materials. That is, the magnetic permeability is deteriorated by the eddy current occurring at a frequency lower than a frequency at which the magnetic resonance occurs.

In order to resolve the problem, a known approach is to use thin films of the soft magnetic material taking the skin effect into consideration. An example is a layered product which comprises soft magnetic thin films and dielectric thin films alternately overlaid or stacked one after another.

However, the layered product has another problem that the displacement current flows through the dielectric thin films in the product. The displacement current deteriorates the magnetic permeability. The displacement current is dependent on the size of the magnetic films in the layered product. This teaches that use of the soft magnetic powder resolves the problem of the dielectric current.

SUMMARY OF THE INVENTION

Accordingly, it is an object of the present invention to provide a composite magnetic article for an electromagnetic interference suppressor having a high imaginary part permeability $\mu''$ over a wide high frequency range and variable or adjustable magnetic resonance frequencies within a broadened frequency range.

Considering the stress strain of the soft magnetic powder caused at the working from the spherical powder particles into the flaky or flat powder particles, the present invention attempts to use of soft magnetic powder having a positive or negative magnetostriction $\lambda$ which is not zero so as to employ the direction of the magnetic anisotropy caused by the strain.

Further, the present invention also attempts to change the residual strain by annealing so as to bring about magnetic resonance frequencies over a broadened frequency range.

It is a particular object of this invention to provide a composite magnetic article comprising soft magnetic powder which has a thickness thinner than the skin depth, a high aspect ratio so as to obtain the demagnetizing factor of Nd=1, and a surface oxide layer.

According to the present invention, a composite magnetic article is obtained, which comprises: soft magnetic powder of at least one soft magnetic composition having a magnetostriction constant, each of particles of the powder being flaky; and organic binding agent binding the soft magnetic powder dispersed therein.

The magnetostriction constant may be positive or negative.

The soft magnetic powder is preferably one as annealed after being worked flaky.

The soft magnetic flaky particles preferably have an average thickness less than a skin depth within which the skin effect occurs at a frequency band for which the composite magnetic article is used.

The soft magnetic flaky particles are preferably oriented in a direction in the organic binding agent.

Each of the soft magnetic flaky particles preferably has an oxide outer layer.

The oxide outer layer can be formed by subjecting the powder to a surface oxidation by an oxygen containing gas through a vapor phase slow oxidization method or a liquid phase slow oxidization method.

The soft magnetic powder is preferably made of two or more compositions having different magnetostriction constants.

The soft magnetic powder preferably comprises two or more kinds of flaky particles which have been annealed at different annealing conditions.

According to the present invention, a method is provided for producing a composite magnetic article comprising a soft magnetic powder bound by an organic binding agent. The method comprises steps of: preparing a flaky soft magnetic powder by working soft magnetic powder into flaky ones; annealing the flaky soft magnetic powder so as to remove residual strain caused due to the working; mixing the annealed flaky soft magnetic powder with a liquid of the binding agent and a solvent; and shaping the mixture into a shape of the article.

The method may further comprise a step of, after the annealing step before the mixing step, forming an oxide outer layer of each particle of the flaky soft magnetic powder by subjecting the powder to a surface oxidation by an oxygen containing gas through a vapor phase slow oxidization method or a liquid phase slow oxidization method.

Alternatively, the oxide outer layer forming step may be performed after the preparing step but before the annealing step.

In the preparing step, working stress applied to the powder is preferably controlled to vary the residual strain so as to adjust an external frequency of a complex magnetic permeability of the resultant composite magnetic article.

In the annealing step, the annealing condition is preferably controlled to vary the residual strain so as to adjust an external frequency of a complex magnetic permeability of the resultant composite magnetic article.

DESCRIPTION OF PREFERRED EMBODIMENTS

Figure 1:
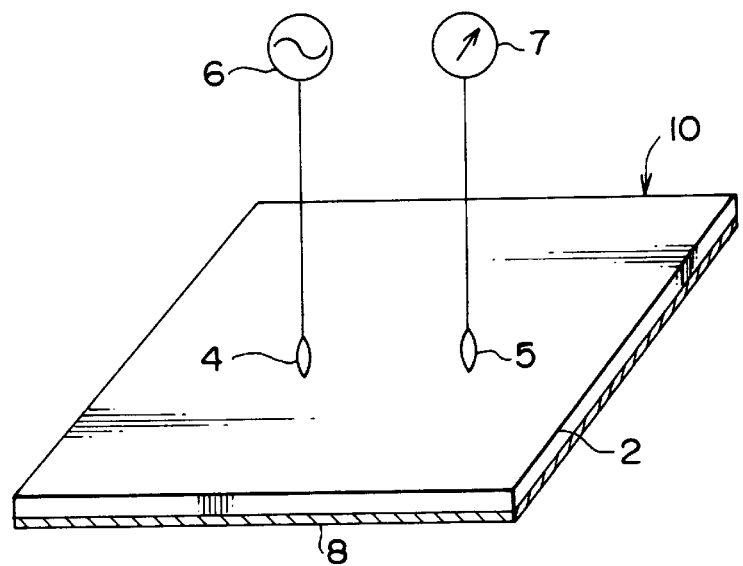
FIG. 1 is a schematic view of an evaluating system for use in evaluation of a characteristic of the electromagnetic interference suppressing body.

In embodiments of the present invention, Fe—Al—Si alloy ("Sendust" which is a registered trademark), Fe—Ni alloy (Permalloy), amorphous alloy or other metallic soft magnetic materials can be used as a start material.

The start material is subjected to grinding, rolling, and tearing to produce powder of flat or flaky particles. In this way, it is important that the flaky particles have an average thickness smaller than a dimension of a depth within which the skin effect occurs and that the flaky powder has an aspect ratio more than 10 in order to make the demagnetizing factor Nd about 1.

The depth will be referred to as the "skin depth" $\delta$, hereinafter. The skin depth $\delta$ is given by:

$$\delta = (\rho/\pi\mu f)^{1/2},$$

where $\rho$, $\mu$, and f represent resistivity, magnetic permeability, and frequency, respectively. It is noted that the skin depth $\delta$ varies in dependence on the frequency f at which the soft magnetic material is used. However, the desired skin depth and the aspect ratio can readily be realized by specifying the average particle size of the powder of the start material.

For grinding, rolling and tearing of the start material, a ball mill, an attritor, a pin mill can preferably be used. Other apparatus can be used therefor which could produce the powder of the thickness and the aspect ratio as described above, and taking the residual strain caused due to working by the apparatus into account.

If the start material has a positive magnetostriction constant $\lambda$, shape magnetic anisotropy and strain magnetic anisotropy are present in the common direction by the rolling and tearing. Therefore, each of worked particles has a total anisotropic magnetic field due to both anisotropy. Accordingly, the anisotropic magnetic field is higher in field level and in the magnetic resonance frequency than that in use of a magnetic material with no magnetostriction ($\lambda=0$) as the start material.

The residual strain caused by the flattering treatment can be relaxed by an appropriate annealing treatment. Therefore, the soft magnetic powder as being annealed has a magnetic resonance at a frequency fr which is dependent on the annealing condition. The magnetic resonance frequency fr is lower after the annealing than before annealing and is higher than that in use of a magnetic material with no magnetostriction ($\lambda=0$). Therefore, the magnetic resonance frequency can be adjusted by control of the annealing condition. If the start material has a negative magnetostriction constant ($\lambda<0$), the direction of the strain magnetic anisotropy due to the residual strain is perpendicular to that of the shape magnetic anisotropy, so that the anisotropic magnetic field is relatively low with a low magnetic resonance frequency in comparison with the magnetic material with no magnetostriction ($\lambda=0$).

Therefore, by combination of the shape magnetic anisotropy, the positive or negative magnetostriction constant, and the annealing condition, it is possible to provide various composite magnetic articles having different magnetic resonance frequencies within a relatively wide frequency band.

In the composite magnetic article of the present invention, the soft magnetic powder is provided with a dielectric outer surface layer so as to electrically isolate each powder particle from adjacent powder particles even in high powder loaded density. The dielectric outer surface layer is composed of a metal oxide which is formed by surface oxidation of metallic magnetic powder. In the magnetic powder of, for example, Fe—Al—Si alloy, the oxide layer is mainly composed of $AlO_x$ and $SiO_x$.

For surface oxidation of the metallic magnetic powder, known liquid phase slow oxidization method and gas phase slow oxidization method can preferably and alternatively be used, considering easy control, stability and safety. In the both methods, nitrogen-oxygen mixture gas with a controlled oxygen partial pressure is introduced into an organic solvent of hydrocarbon in the former method but into an inert gas in the latter method.

The surface oxidation and the annealing can be carried out in the order as described, but they may be in the reversed order, and can be performed simultaneously.

As the organic binder or binding agent used in the present invention, there are recommended polyester resin, polyethylene resin, polyvinyl chloride resin, polyvinyl butyral resin, polyurethane resin, cellulose resin, ABS resin, nitrile-butadiene rubber, stylene-butadiene rubber, epoxy resin, phenol resin, amide resin, imide resin, or copolymers thereof.

In order to produce the composite magnetic article, the flaky magnetic powder is mixed with and dispersed in the organic binder and formed into a desired article shape. The mixing and shaping are carried out by use of proper apparatus selected from known mixing and shaping apparatus.

In the composite magnetic article, the magnetic powder is oriented in a direction. The orientation can be performed by use of a shearing force or a magnetic field.

Now, several examples will be demonstrated below.

At first, a plurality of start powder samples of Fe—Ni alloy and Fe—Al—Si alloy which samples have different magnetostriction constants were prepared by the water atomizing method. The start powder samples were subjected to grinding, rolling and tearing processes at different conditions, respectively, then subjected to the liquid phase slow oxidation treatment where each of the samples was agitated about eight hours in a hydrocarbon organic solvent into which a nitrogen-oxygen mixture gas with 35% oxygen partial pressure was introduced, and thereafter, was subjected to classification. Thus, a plurality of sample powders were obtained which have different anisotropic magnetic fields Hk.

The resultant powder samples were confirmed to have oxide film on the outer surface of each powder particle, by surface analysis of each particle.

In use of the gas phase slow oxidization method where the sample powder was put in an inert gas into which a nitrogen-oxygen mixture gas with 20% oxygen partial pressure was introduced, formation of oxide film on the outer surface of the sample powder was also confirmed.

Then, composite magnetic articles were produced using the powder samples and were subjected to measurement of the magnetic permeability frequency ($\mu$-f) response and examination of the electromagnetic interference suppressing ability.

In measurement of the $\mu$-f response, a test ring of the composite magnetic article of the present invention was prepared and was inserted into a test fixture having a one-turn coil. The impedances of the coil were measured at various frequencies of the AC current flowing through the coil to obtain $\mu'$ and $\mu''$.

The examination of the electromagnetic interference suppressing ability was carried out by use of the evaluating system shown in FIG. 1. A test sample 2 of the composite magnetic article of the present invention was a square plate of 20 cm×20 cm with a thickness of 2 mm. The test plate 2 was backed with a copper plate 8 to form a test piece of the electromagnetic interference suppressor. An electromagnetic wave generator 6 and a network analyzer 7 were connected to transmitting and receiving loop antennas 4 and 5, each having a fine loop of a diameter of 1.5 mm, respectively. The electromagnetic wave was emitted by the generator 6 through the antenna 4, and the electromagnetic field strength received at the receiving antenna 5 was measured by the analyzer 7.

EXAMPLE 1

A soft magnetic paste was prepared which had a composition as follows:

| | |
|---|---|
| Flat soft magnetic powder A | 95 weight parts |
| Composition: Fe—Al—Si alloy | |
| Average particle diameter: $\phi$ 20 $\mu$m × 0.3 $\mu$m(t) | |
| Magnetostriction: +0.72 | |
| Annealing: No | |
| Polyurethane resin: | 8 weight parts |
| Hardening Agent | 2 weight parts |
| (Isocyanate compound) | |
| Solvent (Mixture of cyclohexanone and toluene) | 40 weight parts |

It is noted here that the magnetostriction is given by $(dl/l) \times 10^{-6}$. The representation of "dl" is a strain of a size of "l" at a magnetic field of H=200 oersted. This is also similar in samples 2, 4, 5, and 6 hereinafter.

From the paste, a film sample 1 was formed by a doctor blade process followed by hot-pressing and then curing at 85° C. for 24 hours.

Film sample 1 was analysed by use of a scanning electron microscope and it was thereby confirmed that the directions of magnetic particle alignment are in the surface of the sample.

EXAMPLE 2

Another soft magnetic paste was prepared which had a composition as follows:

| | |
|---|---|
| Flat soft magnetic powder B | 95 weight parts |
| Composition: Fe—Al—Si alloy | |
| Average particle diameter: $\phi$ 20 $\mu$m × 0.3 $\mu$m(t) | |
| Magnetostriction: +0.72 | |
| Annealing: 650° C., 2 hours | |
| Polyurethane resin: | 8 weight parts |
| Hardening Agent | |
| (Isocyanate compound) | 2 weight parts |
| Solvent (Mixture of cyclohexanone and toluene) | 40 weight parts |

From the paste, a film sample 2 was formed by a doctor blade process followed by hot-pressing and then curing at 85° C. for 24 hours.

Film sample 2 was analysed by use of a scanning electron microscope and it was thereby confirmed that the directions of magnetic particle alignment are in the surface of the sample.

EXAMPLE 3

Another soft magnetic paste was prepared which had a composition as follows:

| | |
|---|---|
| Flat soft magnetic powder C | 95 weight parts |
| Composition: Fe—Ni alloy | |
| Average particle diameter: $\phi$ 30 $\mu$m × 0.4 $\mu$m(t) | |
| Magnetostriction: −1.03 | |
| Annealing: No | |

|  |  |
|---|---|
| Polyurethane resin: | 8 weight parts |
| Hardening Agent | 2 weight parts |
| (Isocyanate compound) | |
| Solvent (Mixture of cyclohexanone and toluene) | 40 weight parts |

From the paste, a film sample 3 was formed by a doctor blade process followed by hot-pressing and then curing at 85° C. for 24 hours.

Film sample 3 was analysed by use of a scanning electron microscope and it was thereby confirmed that the directions of magnetic particle alignment are in the surface of the sample.

EXAMPLE 4

Another soft magnetic paste was prepared which had a composition as follows:

|  |  |
|---|---|
| Flat soft magnetic powder A | 60 weight parts |
| Composition: Fe—Al—Si alloy | |
| Average particle diameter: φ 2 μm × 0.3 μm(t) | |
| Magnetostriction: 0.72 | |
| Annealing: No | |
| Flat soft magnetic powder B | 35 weight parts |
| Composition: Fe—Al—Si alloy | |
| Average particle diameter: φ 20 μm × 0.3 μm(t) | |
| Magnetostriction: +0.72 | |
| Annealing: 650° C., 2 hours | |
| Polyurethane resin: | 8 weight parts |
| Hardening Agent | 2 weight parts |
| (Isocyanate compound) | |
| Solvent (Mixture of cyclohexanone and toluene) | 40 weight parts |

From the paste, a film sample S4 was formed in the similar manner as in EXAMPLE 1.

Film sample 4 was similarly confirmed that the directions of magnetic particle alignment are in the surface of the sample.

EXAMPLE 5

Another soft magnetic paste was prepared which had a composition as follows:

|  |  |
|---|---|
| Spherical soft magnetic powder D | 95 weight parts |
| Composition: Fe—Al—Si alloy | |
| Average particle diameter: φ 15 μm | |
| Polyurethane resin: | 8 weight parts |
| Hardening Agent | 2 weight parts |
| (Isocyanate compound) | |
| Solvent (Mixture of cyclohexanone and toluene) | 40 weight parts |

From the paste, a comparative film sample 5 was formed in the similar manner as in EXAMPLE 1.

Film sample 4 was similarly confirmed by use of the scanning electron microscope that the directions of magnetic particle alignment are isotropic.

EXAMPLE 6

Another soft magnetic paste was prepared which had a composition as follows:

|  |  |
|---|---|
| Flat soft magnetic powder E | 95 weight parts |
| Composition: Fe—Al—Si alloy | |
| Average particle diameter: φ 20 μm × 0.4 μm(t) | |
| Magnetostriction: 0 | |
| Polyurethane resin: | 8 weight parts |
| Hardening Agent | 2 weight parts |
| (Isocyanate compound) | |
| Solvent (Mixture of cyclohexanone and toluene) | 40 weight parts |

From the paste, a comparative film sample 6 was formed in the similar manner as in EXAMPLE 1.

Comparative film sample 6 was confirmed by use of a scanning electron microscope that the directions of magnetic particle alignment is in the surface of the sample.

Table 1 shows a real magnetic permeability $\mu'$ and a magnetic resonance frequency fr of each of the samples 1–6.

TABLE 1

|  | Powder Loaded Rate | *Real Magnetic Permeability $\mu'$ | Magnetic Resonance Frequency fr |
|---|---|---|---|
| Sample 1 | 30% | 14 | 50 MHz |
| Sample 2 | 29% | 16 | 30 MHz |
| Sample 3 | 33% | 19 | 20 MHz |
| Comparative Sample 5 | 53% | 10 | **10 MHz |
| Comparative Sample 6 | 31% | 17 | 25 MHz |

*$\mu'$ at f = 10 MHz
**Magnetic resonance is unclear

Figure 2:
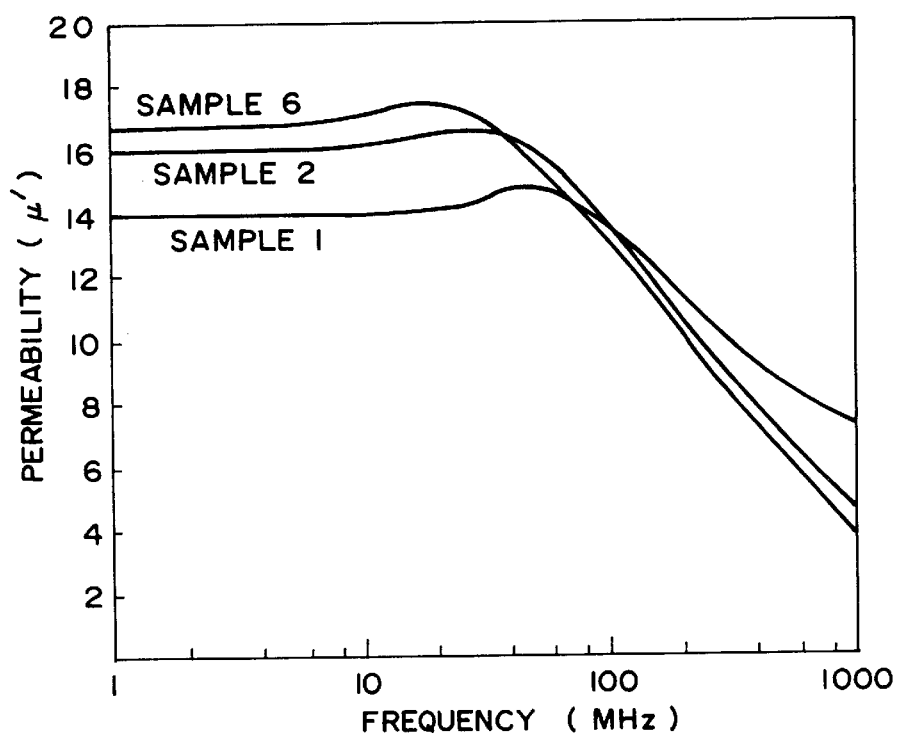
FIG. 2 is a graphic view illustrating magnetic permeability frequency responses of samples of the present invention and comparative sample.

FIG. 2 shows $\mu$–f characteristic curves of

As will be understood from FIG. 2, sample 1, in which the magnetic powder having the positive magnetostriction is used, has the highest magnetic resonance frequency fr, while sample 6, in which the magnetic powder having a magnetostriction of zero, has the highest real magnetic permeability. Sample 2 uses the magnetic powder which is similar to that in sample 1 but is subjected to the annealing. As regards the magnetic resonance frequency fr and the real magnetic permeability $\mu'$, sample 2 has intermediate values between those in samples 1 and 6.

On the other hand, it is noted from Table 1 that the magnetic resonance frequency fr of sample 3 having a negative magnetostriction is lower than that of sample 6, but the real magnetic permeability $\mu'$ of sample 3 is higher than that of sample 6.

Comparative sample 5 using spherical magnetic powder is quite low in real magnetic permeability $\mu'$, comparing with any other samples 1–4 and comparative sample 6.

It will be understood from the examples as described above that the magnetic permeability of a composite magnetic article can be controlled over a broad frequency band by use of the magnetic powder having the magnetostriction of zero and by changing the residual strain of the powder by annealing. In addition, it is noted that the composite magnetic article can be provided with a high magnetic permeability at a high frequency region by specifying a thickness of the magnetic particles of the powder and by forming a dielectric cover layer on an outer surface of the magnetic powder.

Table 2 shows various data of sample 4 and comparative sample 5.

TABLE 2

|  |  | Sample 4 | Sample 5 |
|---|---|---|---|
| Powder Loaded Rate |  | 31% | 53% |
| Surface Resistance |  | $9 \times 10^7$ Ω | $4 \times 10^7$ Ω |
| $\mu''$ Distribution |  | broad | narrow |
| Attenuation | 800 MHz | 6.5 dB | 3.8 dB |
|  | 1.5 GHz | 7.7 dB | 4.3 dB |

In Table 2, the surface resistance values were measured by the ASTM-D-257 method, $\mu''$ distribution is based on the mutual comparison of samples 4 and 5, and attenuation values were based on the value of copper as the reference and represent the electromagnetic interference suppressing effect.

It will be understood from Table 2 that both of sample 4 and comparative sample 5 have surface resistance values of $10^7$–$10^8$Ω. This means that the composite magnetic article is made non-conductive by use of magnetic powder oxidized at at least the surface. Thus, the article can suppress the surface reflection of the electromagnetic wave which is usually present by an impedance mismatch in use of a conductor or a magnetic metallic bulk. Further, it will be noted that sample 4 is lower than comparative sample 5 in the powder loading rate but is superior to in the electromagnetic interference suppressing effect. This means that the broad $\mu''$ distribution is effective for the electromagnetic interference suppressing effect.

What is claimed is:

1. A composite article formed of soft magnetic powder in which particles thereof comprise at least one soft metal composition having a magnetostriction constant which is either positive or negative, said particles being in the form of flakes dispersed through an organic binder, said magnetic flakes having an average thickness of less than a skin depth within which a skin effect occurs at a frequency band at which said composite magnetic article is used.

2. The composite metal article as in claim 1, wherein said soft magnetic powder is annealed after being worked to form flakes.

3. A composite magnetic article as claimed in claim 1, wherein said soft magnetic powder is comprised of two or more compositions having different magnetostriction constants.

4. A composite magnetic article as claimed in claim 3, wherein said soft magnetic particles are oriented in a direction in said organic binder.

5. The composite magnetic article as in claim 4, wherein each of the soft magnetic flakes has an oxide outer layer.

6. The composite magnetic article as claimed in claim 5, wherein said oxide layer is formed by oxidation.

7. The composite metal article as in claim 6, wherein the oxidation is carried out in an oxygen-containing gas or a liquid.

8. A composite magnetic article as in claim 7, wherein said article is electrically non-conductive.

9. The composite magnetic article as claimed in claim 8, wherein said soft magnetic powder is comprised of two or more kinds of powder flakes which have been annealed under different annealing conditions.

10. A method for producing a composite magnetic article from a soft magnetic powder comprising at least one soft metal composition dispersed as particles through an organic binder, said method comprising:
    working particles of said soft magnetic powder and forming flakes thereof;
    annealing said flakes to remove residual strain produced during working;
    mixing said annealed flakes of soft magnetic powder with a liquid comprising said organic binding agent and a solvent to form a mixture thereof; and
    shaping said mixture into an article.

11. The method as in claim 10, wherein following the annealing of said flakes, the flakes are subjected to surface oxidation by an oxidizing gas or by contact with an oxidizing liquid.

12. The method as claimed in claim 10, wherein working stress applied to said powder to produce flakes is controlled to vary the residual strain so as to adjust an external frequency of complex magnetic permeability of the resultant composite magnetic article.

13. The method as claimed in claim 10, wherein the annealing condition of the powder is controlled to vary the residual strain to enable the adjustment of external frequency of a complex magnetic permeability of the composite magnetic article.

14. An electromagnetic interference suppressing body formed of said composite magnetic article as claimed in claim 1.

* * * * *